United States Patent
Kim et al.

(10) Patent No.: US 6,930,518 B2
(45) Date of Patent: Aug. 16, 2005

(54) LEVEL SHIFTER HAVING LOW PEAK CURRENT

(75) Inventors: Kyung-Wol Kim, Seoul (KR); Yong-Weon Jeon, Suwon (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/777,862

(22) Filed: Feb. 12, 2004

(65) Prior Publication Data

US 2004/0160262 A1 Aug. 19, 2004

(30) Foreign Application Priority Data

Feb. 18, 2003 (KR) .............................. 10-2003-0010049

(51) Int. Cl.[7] .............................................. H03B 1/00
(52) U.S. Cl. ........................ 327/112; 327/333; 326/68
(58) Field of Search ................................ 327/108, 112, 327/170, 333, 391, 427, 581, 309, 318, 315; 326/68, 80, 81, 83, 87; 365/189.11; 345/92, 98

(56) References Cited

U.S. PATENT DOCUMENTS 5,378,932 A   1/1995   Shin et al. ................... 327/333
6,043,679 A * 3/2000   Kwon .......................... 326/68
6,459,322 B1 * 10/2002  Cho ............................ 327/333
2004/0032291 A1  2/2004  Tseng ......................... 327/33

FOREIGN PATENT DOCUMENTS

KR   2001 0084439    9/2001

* cited by examiner

*Primary Examiner*—Long Nguyen
(74) *Attorney, Agent, or Firm*—F. Chau & Associates, LLC

(57) ABSTRACT

A level shifter changes an input signal whose level changes between a first voltage level and a ground voltage level into an output signal whose level changes between a second voltage level and the ground voltage level. The level shifter comprising a first input transistor and a second input transistor which receive the input signal and an inversion signal of the input signal, respectively; a first load transistor and a second load transistor, one side of each transistor being connected to the second voltage level; a first switch transistor connected between the first load transistor and the first input transistor, responding to the inversion signal; a second switch transistor connected between the second load transistor and the second input transistor, responding to the input signal; a first output unit for generating an output signal; and a second output unit that generates a complementary signal of the output signal.

9 Claims, 3 Drawing Sheets

LEVEL SHIFTER HAVING LOW PEAK CURRENT

BACKGROUND OF THE INVENTION

1. Field of the Invention

The present invention relates to a level shifter, and more particularly, to a level shifter used in a Thin Film Transistor Liquid Crystal Display (TFT-LCD) driver.

2. Description of Related Art

A level shifter is a circuit that changes a first low-potential voltage level into a second high-potential voltage level. Typically, several hundred level shifters are included in a TFT-LCD driver. Thus, an increase in peak currents in the level shifters results in an increase in power consumption of the driver. Thus, to decrease the power consumption in the driver, the peak currents in the level shifters need to be reduced.

FIG. 1 is a circuit diagram of a conventional level shifter used in a TFT-LCD driver. FIG. 2 is a timing diagram illustrating the operation of the conventional level shifter shown in FIG. 1.

Referring to FIG. 1, the conventional level shifter includes. PMOS transistors MP1 through MP4, NMOS transistors MN1 and MN2, and inverters INV1 through INV3. In FIG. 1, VCC denotes a first voltage level and VDD denotes a second voltage level that has a higher electric potential than the first voltage level VCC. DATA denotes an input signal whose level changes between the first voltage level VCC and a ground voltage level VSS.

More specifically, when the input signal DATA is at the first voltage level VCC, the first PMOS transistor MP1 is turned off and the first NMOS transistor MN1 is turned on, thus lowering the level of a signal at a first node N1 to the ground level VSS. Also, the first inverter INV1 makes an inversion signal DATAB of the input signal DATA, DATAB having a logic low level, e.g., the ground level VSS, and as a result, the third PMOS transistor MP3 is turned on and the second NMOS transistor MN2 is turned off. The fourth PMOS transistor MP4 is turned on in response to the signal at the first node N1 having the ground voltage level VSS. The level of a signal at a second node N2 is increased to the second voltage level VDD. The second PMOS transistor MP2 is turned off in response to a signal at the second node N2. Therefore, an output signal OUT and a complementary output signal OUTB reach the second voltage level VDD and the ground level VSS, respectively.

When the input signal DATA is at the ground voltage level VSS, the first PMOS transistor MP1 is turned on and the first NMOS transistor MN1 is turned off. The inversion signal DATAB of the input signal DATA is at a logic high level, e.g., the first voltage level VCC, and the third PMOS transistor MP3 is turned off and the second NMOS transistor MN2 is turned on. The level of the signal at the second node N2 is lowered to the ground voltage level VSS and the second PMOS transistor MP2 is turned on. The level of the signal at first node N1 is raised to the level of the second voltage level VDD. Also, when the level of the signal at first node N1 changes, the fourth PMOS transistor MP4 is completely turned off. Accordingly, the levels of the output signal OUT and the complementary output signal OUTB reach the ground voltage level VSS and the second voltage level VDD, respectively.

Voltages at the nodes N1 and N2 of the second and fourth PMOS transistor MP2 and MP4, which are cross-coupled to each other, overlap at a point before they reach high and low levels, respectively. Thus, undesired overlap current paths are formed among the first and second PMOS transistors MP1 and MP2 and the first NMOS transistor MN1 and among the third and fourth PMOS transistors MP3 and MP4 and the second NMOS transistor MN2. Gates of a fifth PMOS transistor MP5 and a fifth NMOS transistor MN5, which are included in the second inverter INV2, are connected to the second node N2. Therefore, the fifth PMOS transistor MP5 and the fifth NMOS transistor MN5 are affected directly by the overlap current paths, increasing a total peak current.

Accordingly, it is important to minimize the amount of the total peak current generated by level shifters in a display device, such as the TFT-LCD.

SUMMARY OF THE INVENTION

According to an embodiment of the present invention, a level shifter which changes an input signal whose level changes between a first voltage level and a ground voltage level into an output signal whose level changes between a second voltage level and the ground voltage level, the level shifter comprising a first input transistor and a second input transistor which receive the input signal and an inversion signal of the input signal, respectively; a first load transistor and a second load transistor, one side of each transistor being connected to the second voltage level; a first switch transistor connected between the first load transistor and the first input transistor, the first switch transistor responds to the inversion signal; a second switch transistor connected between the second load transistor and the second input transistor, the second switch transistor responds to the input signal; a first output unit that generates the output signal in response to a signal generated at a connection node between the first load transistor and the first switch transistor and a signal at a connection node between the first input transistor and the first switch transistor; and a second output unit that generates a complementary signal of the output signal in response to a signal generated at a connection node between the second load transistor and the second switch transistor and a signal at a connection node between the second input transistor and the second switch transistor.

It is preferable that the first and second input transistors are NMOS transistors, the first and second load transistors are PMOS transistors, and the first and second switch transistors are PMOS transistors.

It is preferable that the first output unit comprises a PMOS transistor and an NMOS transistor connected in serial between the second voltage level and the ground voltage level, wherein a signal generated at the connection node between the first load transistor and the first switch transistor is applied to a gate of the PMOS transistor, a signal generated at the connection node between the first input transistor and the first switch transistor is applied to a gate of the NMOS transistor, and the output signal is output from a connection node between the PMOS transistor and the NMOS transistor.

It is preferable that the second output unit comprises a PMOS transistor and an NMOS transistor connected in serial between the second voltage level and the ground voltage level, wherein a signal generated at a connection node between the second load transistor and the second switch transistor is applied to a gate of the PMOS transistor, and a signal at a connection node between the second input transistor and the second switch transistor is applied to a gate of the NMOS transistor, the complementary signal of the output signal is output from a connection node between the PMOS transistor and the NMOS transistor.

According to an embodiment of the present invention, a level shifter for changing an input signal whose level changes between a first voltage level and a ground voltage level into an output signal whose level changes between a second voltage level and the ground voltage level, the level shifter comprises first through fourth nodes. The level shifter comprises a first PMOS transistor comprising a source, a drain, and a gate connected to the second voltage level, the first node, and the fourth node, respectively, and a second PMOS transistor comprising a source, a drain, and a gate connected to the first node, the second node, and an inversion signal of the input signal, respectively. The level shifter further comprises a first NMOS transistor comprising a drain, a source, and a gate connected to the second node, the ground voltage level, and the input signal, respectively, a third PMOS transistor comprising a source, a drain, and a gate connected to the second voltage level, the third node, and the second node, respectively, and a fourth PMOS transistor comprising a source, a drain, and a gate connected to the third node, the fourth node, and the input signal, respectively. The level shifter comprises a second NMOS transistor comprising a drain, a source, and a gate connected to the fourth node, the ground voltage level, and the inversion signal of the input signal, respectively, and a fifth PMOS transistor comprising a source, a gate, and a drain connected to the second voltage level, the first node, and an output node, respectively. The level shifter further comprises a third NMOS transistor comprising a drain, a gate, and a source connected to the output node, the second node, and the ground voltage level, respectively, a sixth PMOS transistor comprising a source, a gate, and a drain connected to the second voltage level, the third node, and a complementary output node, respectively, and a fourth NMOS transistor comprising a drain, a gate, and a source connected to the complementary output node, the fourth node, and the ground voltage level, respectively.

The level shifter further comprises an inverter for using the first voltage level as a power source, inverting the input signal, and outputting the inversion signal of the input signal.

BRIEF DESCRIPTION OF THE DRAWINGS

The present invention will become more apparent by describing in detail preferred embodiments thereof with reference to the attached drawings in which.

DETAILED DESCRIPTION OF PREFERRED EMBODIMENTS

Figure 1:
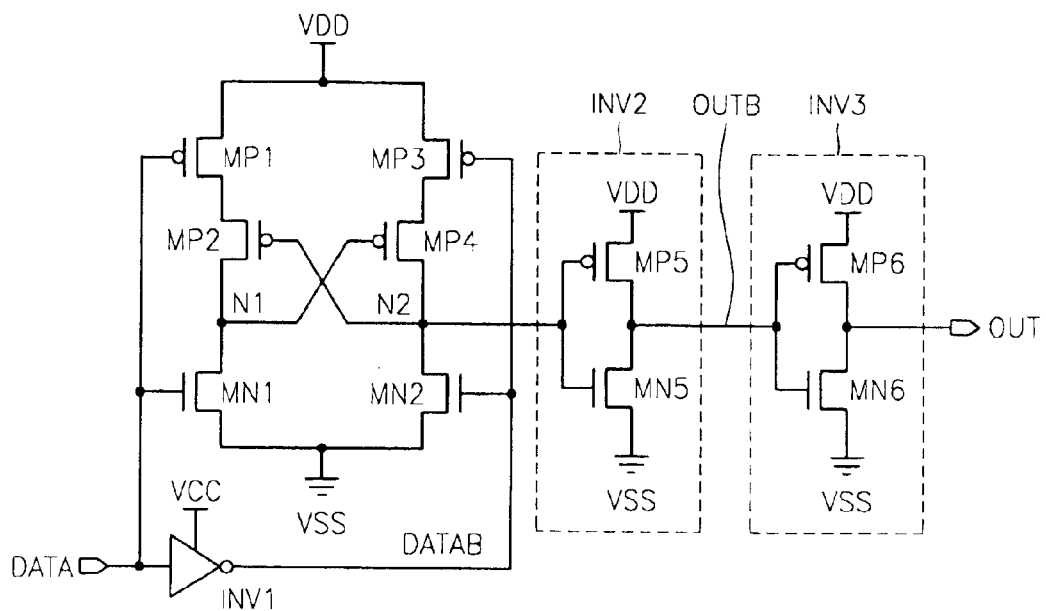
FIG. 1 is a circuit diagram of a conventional level shifter used in a thin film transistor liquid crystal display (TFT-LCD) driver.
Figure 2:
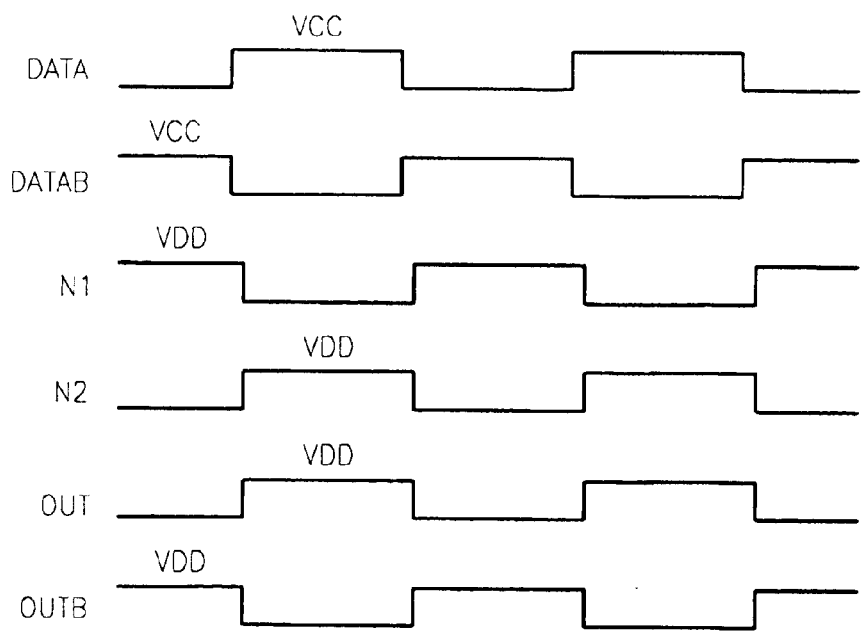
FIG. 2 is a timing diagram illustrating the operation of the conventional level shifter shown in FIG. 1.

Hereinafter, preferred embodiments of the present invention will be described in detail with reference to the accompanying drawings. The same reference numerals represent the same elements throughout the drawings.

Figure 3:
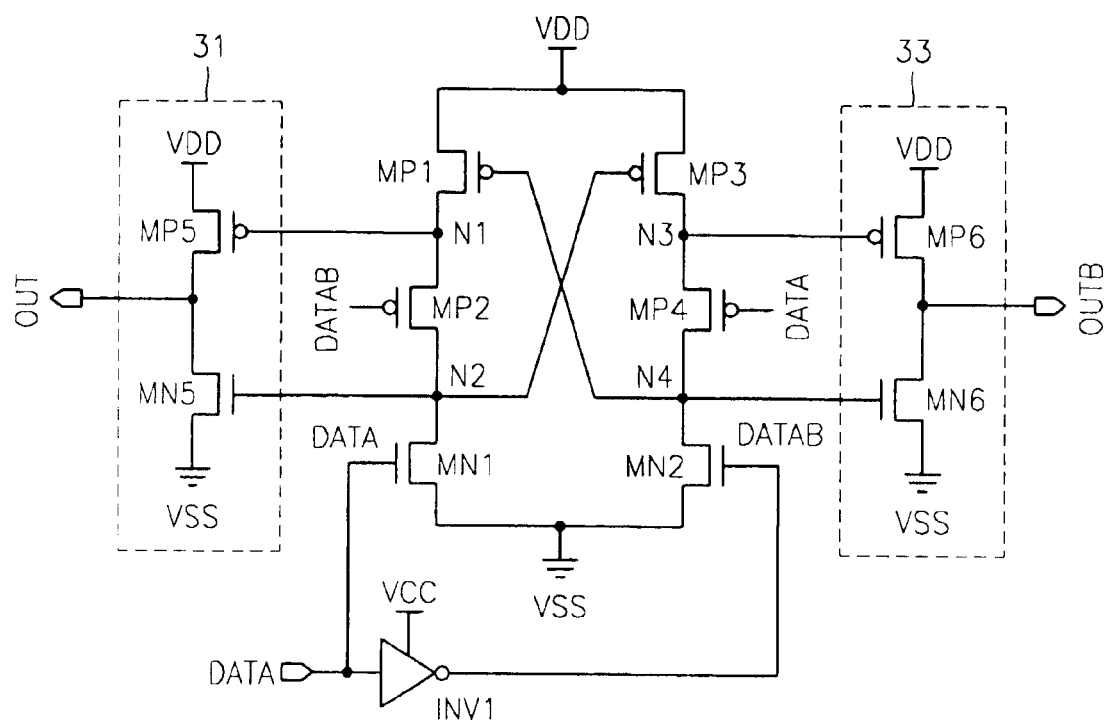
FIG. 3 is a circuit diagram of a level shifter used in a TFT-LCD driver, according to a preferred embodiment of the present invention.

FIG. 3 is a circuit diagram of a level shifter used in a thin film transistor liquid crystal display (TFT-LCD) driver, according to a preferred embodiment of the present invention. Referring to FIG. 3, the level shifter includes a first input transistor MN1, a second input transistor MN2, a first load transistor MP1, a second load transistor MP3, a first switch transistor MP2, a second switch transistor MP4, a first output unit 31, a second output unit 33, and an inverter INV1.

Here, the first and second input transistors MN1 and MN2 are NMOS transistors, and the first and second load transistors MP1 and MP3 and the first and second switch transistors MP2 and MP4 are PMOS transistors. VCC denotes a first voltage level and VDD denotes a second voltage level that has a higher electric potential than the first voltage level VCC.

An input signal DATA is a signal whose level changes between the first voltage level VCC and a ground level VSS. The inverter INV1 uses the first voltage level VCC as a power source, inverts the input signal DATA, and outputs an inversion signal DATAB.

A source, drain, and gate of the PMOS transistor MP1, which is the first load transistor, are connected to the second voltage level VDD, a first node N1, and a fourth node N4, respectively. A source, drain, and gate of the PMOS transistor MP3, which is the second load transistor, are connected to the second voltage level VDD, a third node N3, and a second node N2, respectively.

A source and drain of the PMOS transistor MP2, which is the first switch transistor, are connected to the first node N1 and the second node N2, respectively, and the inversion signal DATAB of the input signal DATA is input to a gate of the PMOS transistor MP2. A source, drain, and gate of the PMOS transistor MP4, which is the second switch transistor, are connected to the third node N3, a fourth node N4, and the input signal DATA, respectively.

A drain, source, and gate of the NMOS transistor MN1, which is the first input transistor, are connected to the second node N2, the ground voltage level VSS, and the inversion signal DATAB, respectively.

The first output unit 31 outputs an output signal OUT in response to signals generated at the first and second nodes N1 and N2. The second output unit 33 outputs a complementary output signal OUTB in response to signals at the third and fourth nodes N3 and N4.

More specifically, the first output unit 31 includes a PMOS transistor MP5 and an NMOS transistor MN5. A source, gate, and drain of the PMOS transistor MP5 are connected to the second voltage level VDD, the first node N1, and an output node from which the output signal OUT is output, respectively. A drain, gate, and source of the NMOS transistor MN5 are connected to the output node, the second node N2, and the ground voltage level VSS, respectively.

The second output unit 33 includes a PMOS transistor MP6 and an NMOS transistor MN6. A source, gate, and drain of the PMOS transistor MP6 are connected to the second voltage level VDD, the third node N3, and a complementary output node from which the complementary output signal OUTB is output, respectively. A drain, gate, and source of the NMOS transistor MN6 are connected to the complementary output node, the fourth node N4, and the ground voltage level VSS, respectively.

Figure 4:
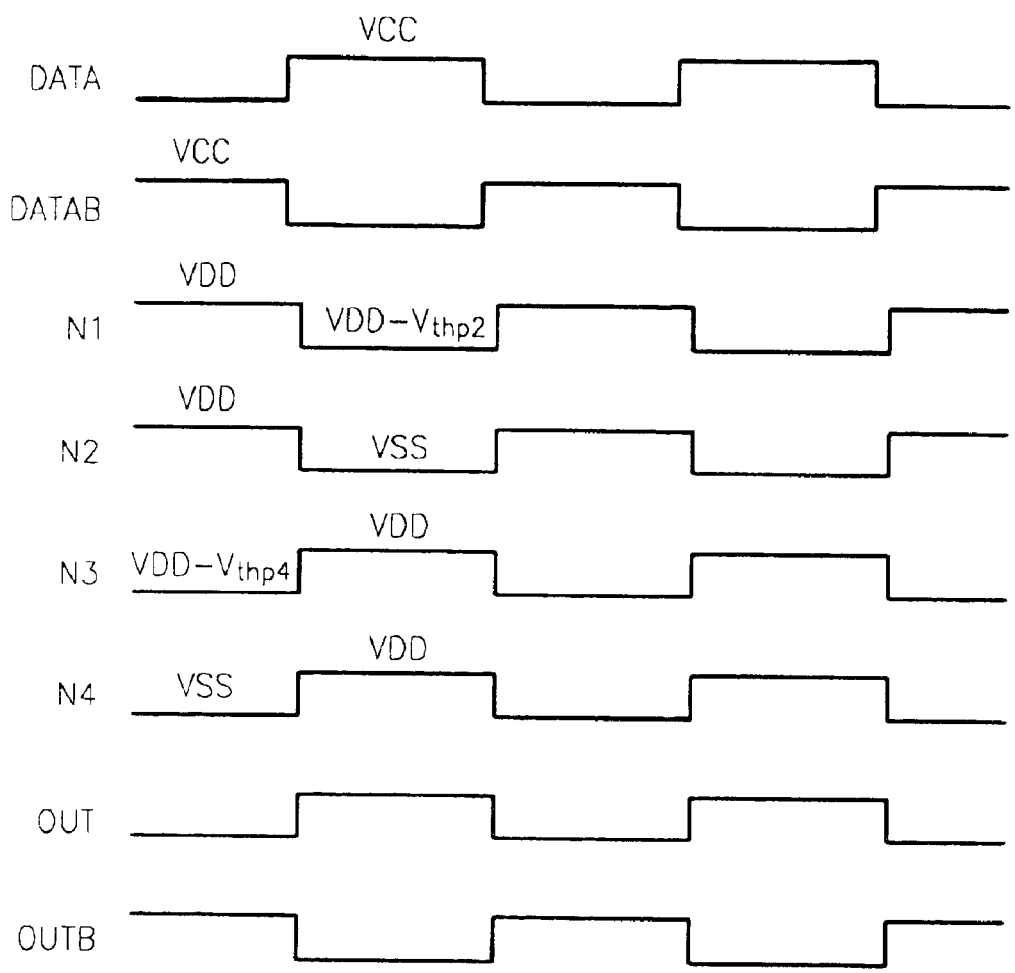
FIG. 4 is a timing diagram illustrating the operation of the level shifter shown in FIG. 3, according to an embodiment of the present invention.

FIG. 4 is a timing diagram illustrating the operation of the level shifter shown in FIG. 3, according to an embodiment of the present invention.

Hereinafter, the operation of the level shifter shown in FIG. 3 will be described with reference to the timing diagram of FIG. 4. First, when the input signal DATA is at a logic high level, e.g., the first voltage level VCC, the PMOS transistor MP1 is turned on and the NMOS transistor MN2 is turned off. The level of the second node N2 is lowered to the ground voltage level VSS, and the PMOS transistor MP3 is turned on, thus raising the level of the third node N3 to the second voltage level VDD.

The input signal DATA is at the first voltage level VCC, and a voltage Vgs between a gate and source of the PMOS transistor MP4 is a level VCC−VDD. The PMOS transistor MP4 is turned on and the level of the fourth node N4 is raised to the second voltage level VDD.

The PMOS transistor MP1 falls within a cut-off zone because the level of the fourth node N4 is at the second voltage level VDD, and a logic low level, e.g., the ground voltage level VSS, is applied to the gate of the PMOS transistor MP2. Thus, the PMOS transistor MP2 reaches a saturation zone, and the voltage level of the first node N1 reaches a level $V_{thp}2+V$. Here, $V_{thp}2$ denotes a threshold voltage of the PMOS transistor MP2, the voltage level of the threshold voltage $V_{thp}2$ being higher than that of a threshold voltage $V_{thp}2$ of the PMOS transistor MLP1. V denotes a minimum voltage needed to saturate the PMOS transistor MP2. When the voltage level of the first node N1 reaches the level $V_{thp}2+V$, the PMOS transistor MP2 operates like a resistor and makes the first and second nodes N1 and N2 have different voltage levels, thereby preventing formation of an overlap current path. As a result, peak current and average current decrease.

A voltage level difference Vgs between Vgs between the gate and source of the PMOS transistor MP5 is a level $V_{thp}2+V-VDD$ that is needed to turn on the PMOS transistor MP5. In this case, the output signal OUT is at the second voltage level VDD and the NMOS transistor MN5 is turned off according to the voltage level of the second node N2. The PMOS transistor MP6 is turned off according to the voltage level of the third node N3 and the NMOS transistor MN6 is turned on according to the voltage level of the fourth node N4. Thus, the complementary output signal OUTB is at the ground voltage level VSS.

Accordingly, in a level shifter according to an embodiment of the present invention, an input to the gate of the PMOS transistor MP5 and an input to the gate of the NMOS transistor MN5 can be separated from each other by the PMOS transistor MP2 acting as a resistor, and an input to the gate of the PMOS transistor MP6 and an input to the gate of the NMOS transistor MN6 can be separated from each other by the PMOS transistor MP4 acting as a resistor, thereby reducing an overlap current. As a result, a peak current decreases. The PMOS transistor MP5 and the NMOS transistor MN5, and the PMOS transistor MP6 and the NMOS transistor MN6 operate with time intervals, thereby reducing overlap current and peak current.

When the input signal DATA is at a logic low level, e.g., the ground voltage level VSS, the NMOS transistor MN2 is turned on and the level of the fourth node N4 is lowered to the ground voltage level VSS. The fourth node N4 is connected to the gate of the PMOS transistor MP1, the PMOS transistor MP1 is turned on, and a voltage level difference Vgs between the gate and source of the PMOS transistor MP2 is VCC−VDD. Thus, the PMOS transistor MP2 is turned on and operates as a switch. Therefore, the second node N2 is at the second voltage level VDD. The NMOS transistor MN1 is turned off, the PMOS transistor MP4 reaches a saturation level, and the third node N3 has an electric potential of $V_{thp}4+V$. As a result, the PMOS transistor MP6 is turned on and the complementary output signal OUTB is at the second voltage level VDD. The NMOS transistor MN6 is turned off according to the voltage level of the fourth node N4. Also, the PMOS transistor MP5 is turned off the voltage level of the first node N1 and the NMOS transistor MN5 is turned on according to the voltage level of the second node N2, thus lowering the level of the output signal OUT to the ground voltage level VSS.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A level shifter for changing an input signal whose level changes between a first voltage level and a ground voltage level into an output signal whose level changes between a second voltage level and the ground voltage level, the level shifter comprising:
   a first input transistor and a second input transistor which receive the input signal and an inversion signal of the input signal, respectively;
   a first load transistor and a second load transistor, one side of each transistor being connected to the second voltage level;
   a first switch transistor connected between the first load transistor and the first input transistor, the first switch transistor responds to the inversion signal;
   a second switch transistor connected between the second load transistor and the second input transistor, the second switch transistor responds to the input signal;
   a first output unit that generates the output signal in response to a signal generated at a connection node between the first load transistor and the first switch transistor and a signal at a connection node between the first input transistor and the first switch transistor; and
   a second output unit that generates a complementary signal of the output signal in response to a signal generated at a connection node between the second load transistor and the second switch transistor and a signal at a connection node between the second input transistor and the second switch transistor.

2. The level shifter of claim 1, wherein the first and second input transistors are NMOS transistors.

3. The level shifter of claim 1, wherein the first and second load transistors are PMOS transistors.

4. The level shifter of claim 3, wherein a gate of the first load transistor is connected to the connection node between the second input transistor and the second switch transistor, and a gate of the second load transistor is connected to the connection node between the first input transistor and the first switch transistor.

5. The level shifter of claim 1, wherein the first and second switch transistors are PMOS transistors.

6. The level shifter of claim 1, wherein the first output unit comprises a PMOS transistor and an NMOS transistor connected in serial between the second voltage level and the ground voltage level,
   wherein the signal generated at the connection node between the first load transistor and the first switch transistor is applied to a gate of the PMOS transistor, the signal generated at the connection node between the first input transistor and the first switch transistor is applied to a gate of the NMOS transistor, and the output signal is output from a connection node between the PMOS transistor and the NMOS transistor.

7. The level shifter of claim 1, wherein the second output unit comprises a PMOS transistor and an NMOS transistor connected in serial between the second voltage level and the ground voltage level, wherein the signal generated at the connection node between the second load transistor and the second switch transistor is applied to a gate of the PMOS transistor, and the signal at the connection node between the second input transistor and the second switch transistor is applied to a gate of the NMOS transistor, the complementary signal of the output signal is output from a connection node between the PMOS transistor and the NMOS transistor.

8. A level shifter for changing an input signal whose level changes between a first voltage level and a ground voltage level into an output signal whose level changes between a second voltage level and the ground voltage level, the level shifter comprising:

first through fourth nodes;

a first PMOS transistor comprising a source, a drain, and a gate connected to the second voltage level, the first node, and the fourth node, respectively;

a second PMOS transistor comprising a source, a drain, and a gate connected to the first node, the second node, and an inversion signal of the input signal, respectively;

a first NMOS transistor comprising a drain, a source, and a gate connected to the second node, the ground voltage level, and the input signal, respectively;

a third PMOS transistor comprising a source, a drain, and a gate connected to the second voltage level, the third node, and the second node, respectively;

a fourth PMOS transistor comprising a source, a drain, and a gate connected to the third node, the fourth node, and the input signal, respectively;

a second NMOS transistor comprising a drain, a source, and a gate connected to the fourth node, the ground voltage level, and the inversion signal of the input signal, respectively;

a fifth PMOS transistor comprising a source, a gate, and a drain connected to the second voltage level, the first node, and an output node, respectively;

a third NMOS transistor comprising a drain, a gate, and a source connected to the output node, the second node, and the ground voltage level, respectively;

a sixth PMOS transistor comprising a source, a gate, and a drain connected to the second voltage level, the third node, and a complementary output node, respectively; and a fourth NMOS transistor comprising a drain, a gate, and a source connected to the complementary output node, the fourth node, and the ground voltage level, respectively.

9. The level shifter of claim 8, further comprising an inverter for using the first voltage level as a power source, inverting the input signal, and outputting the inversion signal of the input signal.

* * * * *